US008341559B2

(12) United States Patent
Rieger et al.

(10) Patent No.: US 8,341,559 B2
(45) Date of Patent: Dec. 25, 2012

(54) INCREMENTAL CONCURRENT PROCESSING FOR EFFICIENT COMPUTATION OF HIGH-VOLUME LAYOUT DATA

(75) Inventors: Michael L. Rieger, Skamania, WA (US); Mathias Boman, Hillsboro, OR (US); Naji V. Bekhazi, Palo Alto, CA (US); Daniel D. Hung, Sunnyvale, CA (US); Michael G. Brashler, Tigard, OR (US); Thomas Brett Hall, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/291,856

(22) Filed: Nov. 8, 2011

(65) Prior Publication Data

US 2012/0054693 A1    Mar. 1, 2012

Related U.S. Application Data

(62) Division of application No. 12/363,674, filed on Jan. 30, 2009, now Pat. No. 8,065,638.

(51) Int. Cl.
*G06F 17/50* (2006.01)
(52) U.S. Cl. ............... 716/51; 716/52; 716/53; 716/55; 430/5
(58) Field of Classification Search .......... 716/51–53, 716/55; 430/5
See application file for complete search history.

(56) References Cited

U.S. PATENT DOCUMENTS

| | | | | |
|---|---|---|---|---|
| 5,128,878 A | * | 7/1992 | Gore et al. ............... | 345/502 |
| 6,152,612 A | * | 11/2000 | Liao et al. ............... | 703/23 |
| 6,487,469 B1 | * | 11/2002 | Formenti ............... | 700/97 |
| 6,493,866 B1 | * | 12/2002 | Mayhew ............... | 716/52 |
| 6,503,666 B1 | * | 1/2003 | Pierrat ............... | 430/5 |
| 6,541,167 B2 | | 4/2003 | Petersen | |
| 7,167,231 B2 | * | 1/2007 | Thuren et al. ............... | 355/53 |
| RE40,084 E | | 2/2008 | Petersen | |
| 7,401,319 B2 | | 7/2008 | Horng | |
| 7,415,694 B2 | * | 8/2008 | Mayhew ............... | 716/54 |
| 7,496,884 B2 | | 2/2009 | Fang | |
| 7,590,966 B2 | * | 9/2009 | Sandstrom et al. ............... | 716/50 |
| 7,617,474 B2 | * | 11/2009 | Pang et al. ............... | 716/139 |
| 7,647,569 B2 | * | 1/2010 | Chen et al. ............... | 716/104 |
| 7,754,401 B2 | | 7/2010 | Fujimura | |
| 7,840,914 B1 | * | 11/2010 | Agarwal et al. ............... | 716/102 |
| 8,103,926 B2 | * | 1/2012 | Gizdarski ............... | 714/729 |
| 8,156,451 B2 | * | 4/2012 | Nagamura et al. ............... | 716/54 |
| 2005/0137734 A1 | * | 6/2005 | Nieuwelaar et al. ............... | 700/100 |
| 2005/0149370 A1 | * | 7/2005 | Brown ............... | 705/8 |
| 2006/0065645 A1 | * | 3/2006 | Nakasu et al. ............... | 219/121.68 |
| 2006/0143589 A1 | * | 6/2006 | Horng et al. ............... | 716/19 |

(Continued)

*Primary Examiner* — Naum Levin
(74) *Attorney, Agent, or Firm* — Park, Vaughan, Fleming & Dowler LLP; Laxman Sahasrabuddhe

(57) ABSTRACT

Some embodiments of the present invention overcome I/O bottlenecks of an EDA work flow by keeping layout data distributed during handoffs among different processing stages. Specifically, some embodiments leverage a concurrent computation paradigm where data is propagated incrementally between stages, and where data processing among consecutive stages and the I/O between stages are executed concurrently. Specifically, some embodiments can generate a template database which contains the unique templates in a set of templates. During operation, an embodiment can determine a set of templates for a layout. Next, the system can determine a processing schedule based on a spatially coherent ordering of the set of templates. Next, the system can process the templates according to the spatially coherent processing schedule. Processing templates in a spatially coherent order can ensure that the downstream processes in the concurrent work flow will be able to maximize concurrency, thereby improving overall performance of the system.

17 Claims, 8 Drawing Sheets

U.S. PATENT DOCUMENTS

2006/0242619 A1* 10/2006 Pang et al. .................. 716/19
2007/0055953 A1   3/2007 Fang
2007/0204210 A1   8/2007 Gormish
2007/0204252 A1   8/2007 Furnish
2007/0234169 A1   10/2007 Rajski
2008/0216076 A1   9/2008 Udell
2009/0035902 A1*  2/2009 Xu et al. ..................... 438/259
2009/0080759 A1*  3/2009 Bhaskar et al. ............... 382/141

* cited by examiner

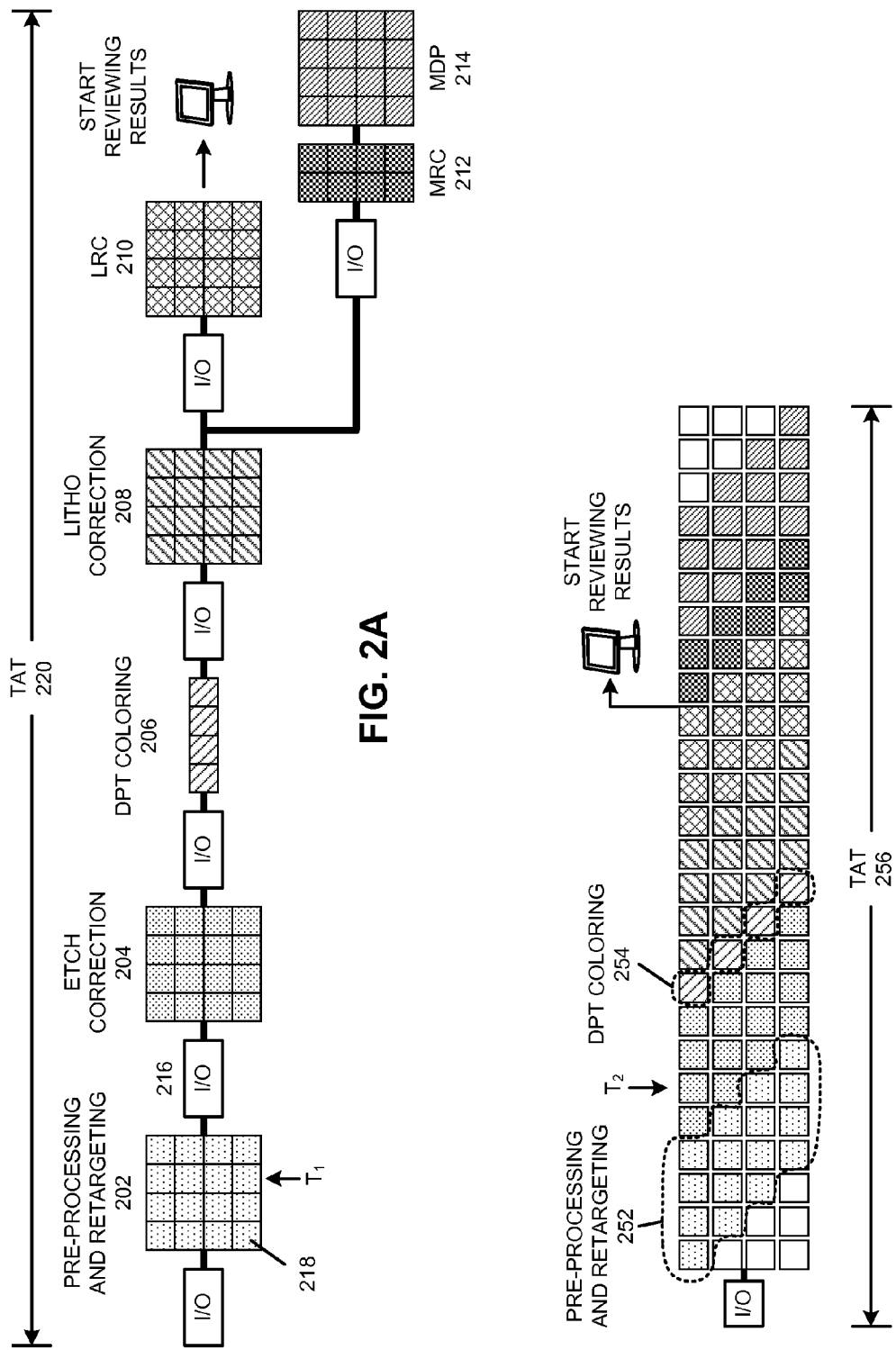

INCREMENTAL CONCURRENT PROCESSING FOR EFFICIENT COMPUTATION OF HIGH-VOLUME LAYOUT DATA

RELATED APPLICATION

This application is a divisional application of, and claims priority under 35 U.S.C. §121 to, U.S. application Ser. No. 12/363,674, entitled "Incremental concurrent processing for efficient computation of high-volume layout data," by the same inventors, filed on 30 Jan. 2009.

BACKGROUND

1. Field

This disclosure generally relates to electronic design automation. More specifically, the disclosure relates to methods and apparatuses to execute processing stages of an electronic design automation work flow in an incremental and concurrent fashion.

2. Related Art

Rapid advances in computing technologies have been made possible by advances in electronic design automation (EDA) tools. The last step in the EDA flow is called mask synthesis, and reducing the turnaround time (TAT) for this step is critical. Foundries often impose stringent TAT requirements on EDA vendors. For example, a foundry may require that the TAT of the mask synthesis step be less than 12 hours.

Unfortunately, due to the rapid increase in the size and complexity of mask data, it is becoming increasingly difficult to meet such TAT requirements. Starting with a two-fold increase in design data volume per process generation, increasing RET (resolution enhancement technology) usage, more aggressive OPC (optical proximity correction), and unavoidable loss of hierarchy from long range-interactions, mask data volume is increasing many-fold per generation.

Specifically, I/O and resource contention are beginning to exhibit serious bottlenecks, throttling actual cycle times. For example, merely transferring one terabyte of layout data (expected at 32 nm process generation) to or from a hard disk drive can take about 3 hours with conventional hard disk drive technology. With multiple handoffs among processing stages, such as RET, OPC, MDP (mask data preparation), etc., the I/O time alone can exceed the TAT requirement. Hence, there is a need for techniques and systems to reduce the TAT for mask synthesis.

SUMMARY

Some embodiments of the present invention overcome the I/O bottleneck by keeping layout data distributed during handoffs among different processing stages. Specifically, some embodiments leverage a concurrent computation paradigm where data is propagated incrementally between stages, and where data processing among consecutive stages and the I/O between stages are executed concurrently.

Instead of representing the layout data in a single large file, some embodiments represent the layout data using at least two types of files. The first type of file is usually small in size, and contains the locations of different fragments of the layout data. The second type of file contains the actual layout data for a particular fragment. Note that the term "file" generally refers to a block of data that can be accessed as a single unit. A file may be stored on a storage device, or it may be received via a network.

Specifically, some embodiments provide systems and techniques for generating a template database for a layout. During operation, the system can determine a set of templates for the layout, wherein each template in the set of templates is associated with an area in the layout. Next, the system can process the templates in a spatially coherent manner so that the downstream processes in the flow will be able to execute concurrently, thereby improving overall performance of the system. For example, in some embodiments, the system can use the set of templates to determine a processing schedule based on a spatially coherent ordering of the templates. Next, the system can select a template for processing according to the spatially coherent processing schedule.

BRIEF DESCRIPTION OF THE FIGURES

FIG. 2A illustrates a non-concurrent work flow.

FIG. 2B illustrates a concurrent work flow in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
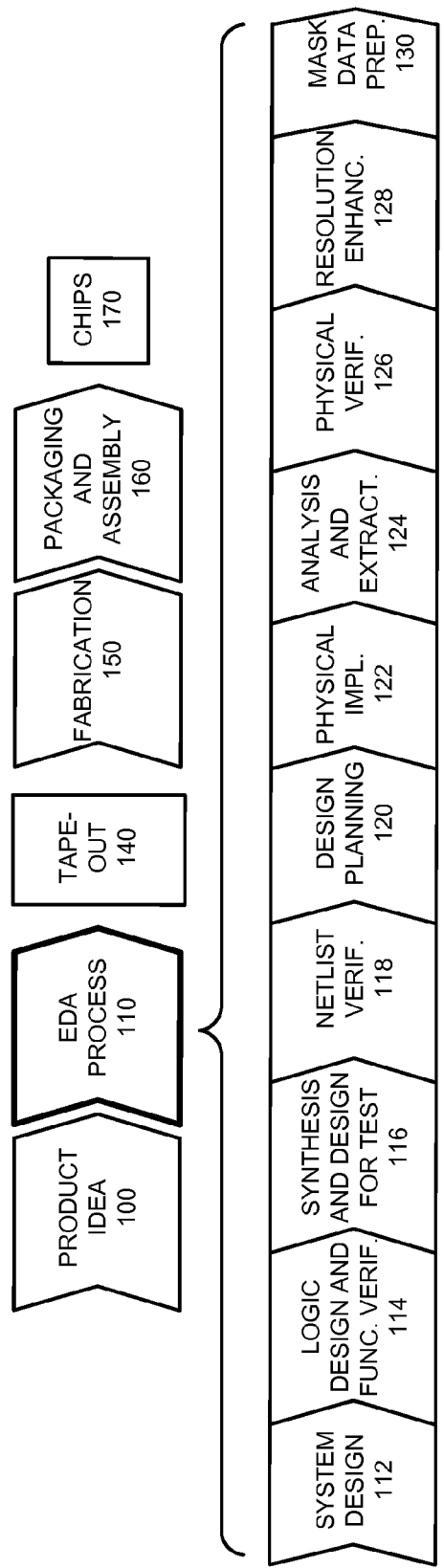
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Embodiments of the present invention can be used during one or more of the above-described steps.

Concurrent Work Flow

The time it takes to perform mask synthesis has been increasing at an alarming rate. Performance increases in microprocessor architectures, and increasing leverage of distributed (parallel) processing algorithms are expected to help keep cycle times manageable. However, I/O and resource contention are beginning to exhibit serious bottlenecks, throttling actual cycle times. Specifically, with multiple handoffs among processing stages, such as RET, OPC, MDP, etc., the I/O time alone can exceed the TAT requirement.

Some embodiments of the present invention overcome the I/O bottleneck by keeping pattern data distributed during handoffs among distributed processing stages. Specifically, some embodiments leverage a concurrent computation paradigm where data is propagated incrementally between stages, and where data processing among consecutive stages and the I/O between stages are executed concurrently.

Embodiments of the present invention provide a number of benefits over conventional approaches. Specifically, embodiments can reduce or eliminate the I/O overhead effect on TAT by making I/O concurrent with processing. Further, embodiments can maximize resource utilization by overlapping low-scalable stages with high-scalable stages, and by spreading utilization of shared resources over time. Additionally, embodiments can reduce cluster interchange storage requirements by using smaller incremental data packages with shorter lifetimes. In addition, embodiments of the present invention can reduce RAM (random access memory) requirements. Note that, in a concurrent approach, a stage that requires a large amount of RAM for its processes does not process all data at the same time in the concurrent work flow. Because the stage processing is distributed over time, only a subset of the cluster processors will need larger amounts of RAM (rather than requiring that all processors in the cluster have maximum memory).

In the mask synthesis context, we are primarily concerned with spatial data associated with physical chip layouts, including polygons, connection nets, pixel fields. One of the key premises of an incremental concurrent distributed flow is that the data is to be partitioned up front, and to remain partitioned throughout the flow. Data is incrementally propagated from one stage to the next, and data is incrementally propagated among partitions as needed to handle spatial scope larger than the partition size. A concurrent work flow avoids the severe I/O bottlenecks seen in sequential flows. Instead of propagating all data defining an intermediate state in large handoffs between stages, the data in the flow remains partitioned with an incremental set of handoffs between stages.

FIG. 2A illustrates a non-concurrent work flow. Note that time progresses from the left to the right in the figure. In other words, the layout data is received at the left side of the figure and is processed by different applications as the data makes it way toward the right side of the figure.

The non-concurrent work flow shown in FIG. 2A includes the following processing stages: pre-processing and retargeting stage 202, etch correction stage 204, double patterning technology (DPT) coloring stage 206, lithography correction stage 208, lithography rule check (LRC) stage 210, mask rule check (MRC) stage 212, and mask data preparation (MDP) stage 214. Between each processing stage, an I/O operation is performed. For example, I/O operation 216 includes writing data from the pre-processing and retargeting stage 202 to the disk, and reading the data from the disk for use in the etch correction stage 204. Each individual square block in the figure indicates that a specific amount of computing resources is being used during a particular time slot. For example, square block 218 may indicate that one server in a compute farm was dedicated for the pre-processing and retargeting stage 202 during the time slot associated with square block 218. Note that each column of square blocks corresponds to a particular time slot. For example, during time slot $T_1$, four servers in a compute farm were dedicated for pre-processing and retargeting stage 202. Once LRC stage 210 is completed, a user can start reviewing results.

The type of processing required in a particular stage can determine whether the stage can be distributed or not. Specifically, computations can have a local scope or global scope. A computation has local scope if it can be independently performed on different portions of the layout in an accurate and efficient manner. On the other hand, a computation has global scope if it cannot be independently performed on different portions of the layout in an accurate and efficient manner. Note that a processing stage that has local scope can be performed in a distributed fashion, whereas a processing stage that has global scope cannot be performed in a distributed fashion. For example, etch correction may have local scope, and hence, it can be performed in a distributed fashion as shown in FIG. 2A. However, DPT coloring may have global scope, and hence, it may not be performed in a distributed fashion as shown in FIG. 2A.

FIG. 2B illustrates a concurrent work flow in accordance with an embodiment of the present invention.

As mentioned above, in a concurrent workflow, the layout is broken up into smaller pieces in a spatially coherent manner, and the processing is spread out in time. Specifically, during any given timeslot, the system may perform one or more stages concurrently. For example, during timeslot $T_2$, the system can concurrently perform pre-processing and retargeting and etch correction on different pieces of data.

Note that, in a concurrent work flow, the system can perform a global scope stage concurrently with other stages, thereby reducing the overall TAT. For example, in FIG. 2A, when the data was being processed by DPT coloring stage 206, no other stage was processing data. In contrast, in the concurrent work flow, the system can execute other stages while DPT coloring stage 254 is being executed. Note that TAT 220 for the non-concurrent work flow is much longer than TAT 256 for the concurrent work flow. Furthermore, in a concurrent work flow, a user can start reviewing results much sooner than in a non-concurrent flow.

Note that some stages may take longer to complete in a concurrent flow because the computation can be spread out over more timeslots. For example, pre-processing and retargeting may require seven time slots in the concurrent work flow, instead of four timeslots in the non-concurrent flow. Specifically, as shown in FIG. 2A and FIG. 2B, pre-processing and retargeting stage 202 may complete sooner than pre-processing and retargeting stage 252. Hence, it is not obvious to use a concurrent flow to reduce the overall turnaround time.

A concurrent flow can greatly increase the opportunities for hiding I/O latencies, and for resource load balancing. Further, note that at most times a single stage uses just a portion of the available resources. Thus, high-value resources (e.g., a computer with a powerful processor and a large amount of memory) can be efficiently shared with low-value resources in the same cluster or compute farm. In contrast, in a non-concurrent flow, all of the computers in the compute farm must be configured with the highest-value resource needed by the most demanding stage.

Concurrent Work Flow: Enabling Technologies

To enable an end-to-end concurrent work flow, the data should ideally remain partitioned in incremental handoffs between stages, and operations in consecutive stages should ideally execute concurrently. Since introducing end-to-end concurrency into the EDA work flow is a fundamental paradigm shift, it is not surprising that a number of enabling technologies are required to implement it.

These enabling technologies can be categorized into three broad categories: (a) technologies that partition data into smaller pieces, (b) technologies that encode the small pieces and enable the pieces to be exchanged between the different stages of the concurrent work flow, and (c) technologies that efficiently schedule tasks and processes that operate on each piece of data. The following sections provide further details of these enabling technologies.

Data Partitioning

Layout data can be partitioned using a number of techniques. Depending on the application, data can be partitioned into overlapping areas or non-overlapping areas. Further, a number of criteria can be used to determine the shapes and sizes of each partition.

For example, one approach can simply be to partition the layout into equal sized rectangular tiles. Another approach can use the cell hierarchy to partition the layout. In yet another approach, the density and/or complexity of patterns can be used to determine the partition size. For example, the system may generate smaller sized partitions in areas that contain a large number of complex geometries, and the system may generate larger sized partitions in areas with simpler geometries.

Further, the system may decide to reorganize partitions as the data moves through the EDA flow. Specifically, the system may merge or split partitions according to the processing requirements of a stage. For example, if a stage performs processing on small partitions, and the output of the stage is provided as input to another stage that prefers larger partitions, the system may merge the small partitions as they come out of the first stage, and feed the merged partitions to the second stage.

In some embodiments, the system may determine a set of unique partitions to improve efficiency. Specifically, if two partitions are the same (e.g., the partitions contain the same patterns), the system may decide to process only one partition and re-use the results for the other partition (details of how the system can determine a set of unique partitions are discussed in a later section).

Regardless of how the layout data is partitioned, techniques and systems are required to encode the partitions and to exchange the partitions between different processing stages. The next section discusses enabling technologies for representing and exchanging incremental layout data.

Hierarchical Decomposition and Incremental Layout-Data Handoff

The major components of an incremental layout-data handoff mechanism can include: 1) a method of decomposing a hierarchic layout into discrete fragments; and 2) a proscribed method of interchanging fragments and metadata from one tool to another. Fragments nominally are data files that can be written, transferred, and read independently (although other media, such as sockets, are not precluded). The premise of the incremental approach is to permit the use of multiple files to represent graphics data, i.e., fragments, and to propagate the fragments incrementally over time.

OASIS and GDS formats are organized as a set of cells that define the hierarchy and data. Each cell may contain polygons and/or references to other cells. Typically, one cell is not referenced by any other cell, and this cell is the root or "topcell" of the hierarchy of cells. Starting from the root cell, its references define branches to "child cells;" their references define sub-branches, and so on, thus defining the complete hierarchy tree. Cells at the tips of the branches contain no references and hence are called "leaf" cells.

A trivial way to decompose a GDS/OASIS layout into fragments is to group subsets of cells into fragments. However, in general, all fragments would have to be taken together to derive the hierarchy tree. This would mean that tools receiving such data in incremental fashion would have to wait until all fragments are collected to begin useful work.

This limitation can be solved by transforming the layout hierarchy with "leaf scaffolding." This operation adds a virtual cell to any cell containing both graphics and references and moves the graphics to the virtual cell. The result is that cells will contain either references to other cells, or graphics, but not both. Now, we can put holder cells into one fragment (or set of fragments) and leaf cells into other fragments. When the "holder" fragment(s) is propagated first, the receiving tool has the complete hierarchic organization (skeleton) of the layout, which greatly enhances its ability to do useful work on subsequent graphics. If the holder cells contain, in addition to references, the boundbox (or estimated boundbox which is the largest possible extent) of the graphics extent of the child cells, the receiving tool can even better determine when useful work can be done without having to read the graphics cells as they become available. In some embodiments, an incremental layout-data handoff system uses multiple files to represent graphics data (i.e., fragments).

In general, incremental layout-data handoff requires some mechanism to communicate to a subsequent stage unambiguous information about the data fragments to be generated by the previous stage (the fragments themselves may not necessarily be available when the dependency information is produced). With the dependency information, the receiving stage can define the (distributed) work it needs to do (before the data is available).

In some embodiments, a status mechanism is used to store and communicate information on which "chunks" of data are available and where to find them. All stages interested in processing data can send and receive data through the status mechanism. For example, as shown in FIG. 2B, pre-processing and retargeting can be performed on graphics cells as they become available. Further, once pre-processing and retargeting is completed on a graphics cell, the system can notify the status mechanism, thereby enabling a computer to perform the next stage (etch correction) using the graphics cell. Note that the status mechanism is only for illustration purposes and is not intended to limit the present invention.

Note that representing the layout data using a skeleton and a set of graphics cells is an important enabler of the concurrent work flow. Specifically, if a stage needs information of how the different fragments are spatially arranged, it can quickly receive the skeleton file because its size is substantially smaller than the entire layout data. Further, the system (e.g., a task scheduler) can use the skeleton file to determine when a particular task has all the data it needs to begin processing.

Representing the layout data using multiple files—e.g., one skeleton file and multiple graphics data files—can increase the total number of bytes required to represent the layout data (which can be as large as a few terabytes for a 32 nm process). In other words, the size of a single layout data file will be less than the sum of the sizes of the skeleton file and the multiple graphics data files. Hence, it is not obvious to use multiple files to represent layout data because it would increase the overall size of the representation. However, some embodiments of the present invention are based in part on the following insight: the benefits of concurrency outweigh the disadvantages of representing the layout data using multiple files.

The "main data" can be stored in fragments, each encoded as legal, standalone OASIS or GDSII files. The hierarchic data defines the structure of the layout and contains, at a minimum, all holder cell definitions. Additionally, the hierarchy should enumerate all leaf cells, and it should provide an estimated bounding box for each leaf and holder cell. Bounding box information can be included in the skeleton main data (e.g., by using the "boundbox" element in OASIS, or by using properties or a reserved layer and polygon in GDSII). In another embodiment, the bounding box information can be included in the metadata. The bounding boxes associated with the dummy leaf cells in the skeleton will be considered estimates (largest possible extent) of the yet-to-be-generated actual leaf cells. Note that the bounding boxes associated with the leaf cell fragments can contain the accurately sized bounding boxes since the graphics are already known at that point.

The leaf cell fragments can contain standard OASIS/GDS cell definitions plus header/trailer records as needed to make the files accessible as "normal" GDS/OASIS files. Note that a viewer would typically overlay all cells in a fragment in cell coordinates, and hence, viewing usefulness is restricted to inspecting one cell at a time. Note that by dividing the main data up into fragments, I/O of the layout data can be concurrently performed with other computation. Further, the layout can always be represented in a single file by collecting all fragments and assembling them to produce a single file.

In some embodiments, the graphic fragments are generated in a "standard" spatial order. A metric may be included in the status information that tracks a sweep-coordinate along one dimension such that all graphics data between an edge of the layout and the sweep-coordinate is completely generated. Fragment sizes can be determined by the generating application to optimize for the computing environment in which the application is running Note that a specific spatial ordering may be required to perform certain types of processing. Hence, a metric that assesses the spatial coherency of a given output can be maintained to enable an application to determine whether the data is being generated in a specific spatial order.

Figure 2C:
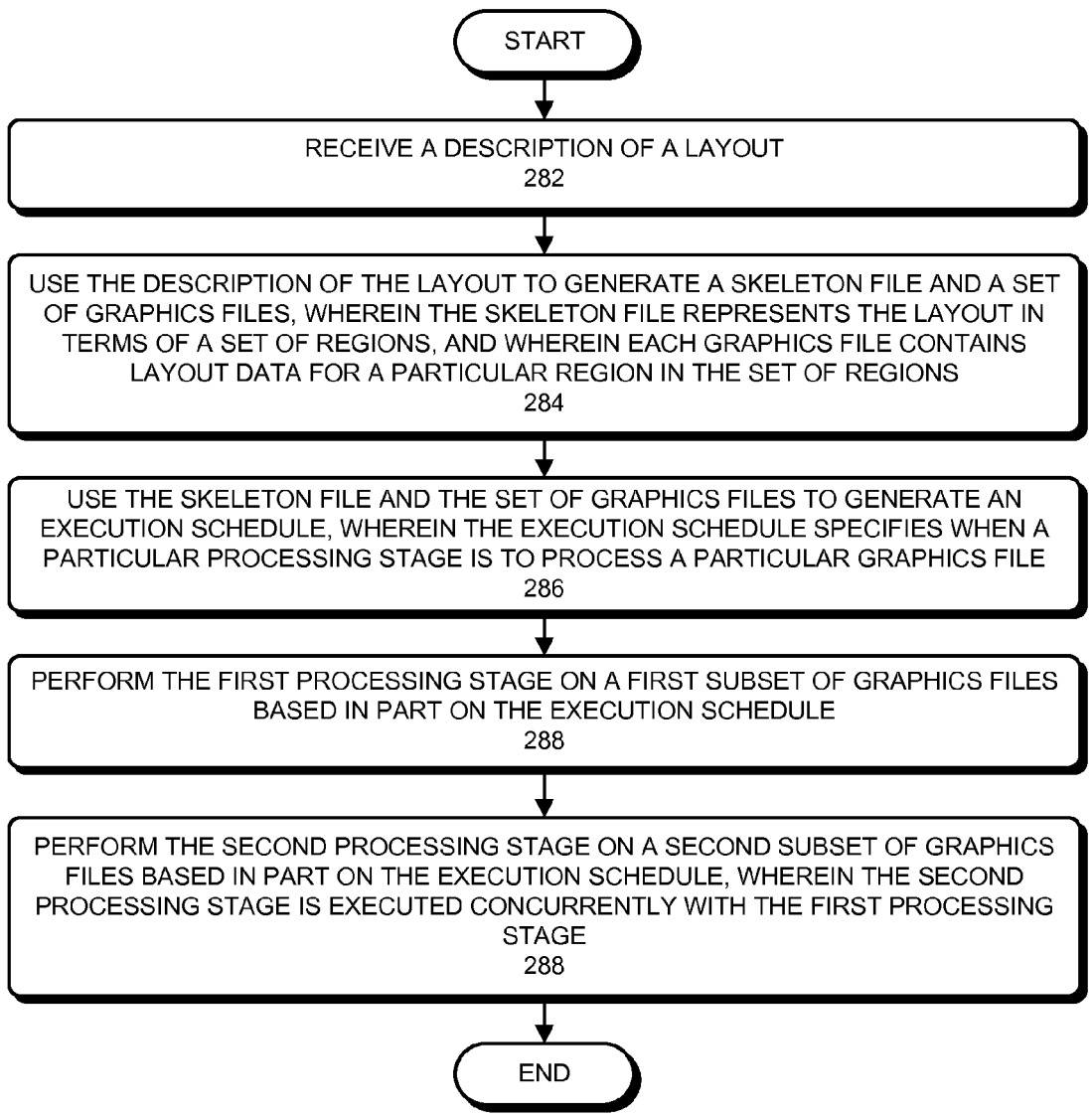
FIG. 2C presents a flow chart that illustrates a process for concurrently executing processing stages of an EDA work flow in accordance with an embodiment of the present invention.

FIG. 2C presents a flow chart that illustrates a process for concurrently executing processing stages of an EDA work flow in accordance with an embodiment of the present invention.

The process can begin by receiving a description of a layout (block 282). The layout description can be a single OASIS or GDSII file. Note that the term "file" generally refers to a block of data that can be accessed as a single unit. A file may be stored on a storage device, or it may be received via a network.

Next, the system can use the description of the layout to generate a skeleton file and a set of graphics files, wherein the skeleton file represents the layout in terms of a set of regions, and wherein each graphics file contains layout data for a particular region in the set of regions (block 284).

The system can then use the skeleton file and the set of graphics files to generate an execution schedule, wherein the execution schedule specifies when a particular processing stage is to process a particular graphics file (block 286).

Next, the system can perform the first processing stage on a first subset of graphics files based in part on the execution schedule (block 288). In some embodiments, the system may process the graphics files in a spatially coherent order.

The system can then perform the second processing stage on a second subset of graphics files based in part on the execution schedule, wherein the second processing stage is executed concurrently with the first processing stage (block 290).

In some embodiments, dependencies can be determined by each processing stage in a distributed manner instead of being determined by a centralized scheduler. For example, a system can execute the first processing stage, thereby causing the first processing stage to receive the skeleton file and the set of graphics files, and start processing the set of graphics files.

Next, the system can execute the second processing stage concurrently with the first processing stage, wherein the second processing stage receives the skeleton file while the set of graphics files are being processed by the first processing stage. Note that the skeleton file can enable the second processing stage to determine interdependencies between the set of graphics files, so that the second processing stage starts processing a graphics file in the set of graphics files only when the first processing stage has finished processing graphics files that are required to perform the second processing stage on the graphics file. Alternatively, the second stage can specifically request the first stage to process certain graphics files so that the second stage can start its processing.

Scheduling Tasks for a Concurrent Work Flow

The various stages of a concurrent work flow can have complex interdependencies between them. In theory, if all distributed tasks and their dependencies are known for the entire flow, an optimum execution order for all tasks can be solved with this information (in the context of other optimization criteria). However, in practice, it may not be possible to know all tasks throughout the flow up front because the organization of tasks for some stages may depend on computed results from prior stages. In such scenarios, a hint (e.g., do things in sweep order from defined edge to other edge) may be needed at intermediate scheduling points to ensure that the data is likely coming in close to the optimum order needed by subsequent stages.

Note that the task dependencies may cause the data to be automatically processed in a spatially coherent manner. For example, the enforcement of sweep-ordered processing could be the result of intelligent overall scheduling. The solution would likely contain sweep-like internal flows, even though the scheduler was unaware of this execution pattern as an objective.

If the consumer of the flow requires/prefers the data in a particular spatial order, the system may provide that order as an input to the task scheduler. The scheduler can then schedule processes so that sequences within preceding stages will fall in line as needed to achieve optimum scheduler objectives. Note that a benefit of this approach is that only the scheduler needs to be aware of the specific spatial ordering; the individual tasks simply execute when they are told to.

Some embodiments of the present invention can use a master scheduler that schedules tasks across the entire concurrent work flow. The scheduler can launch tasks based on resource availability, license availability, and minimum cycle time to achieve priority outputs (which can be set by user).

Figure 2D:
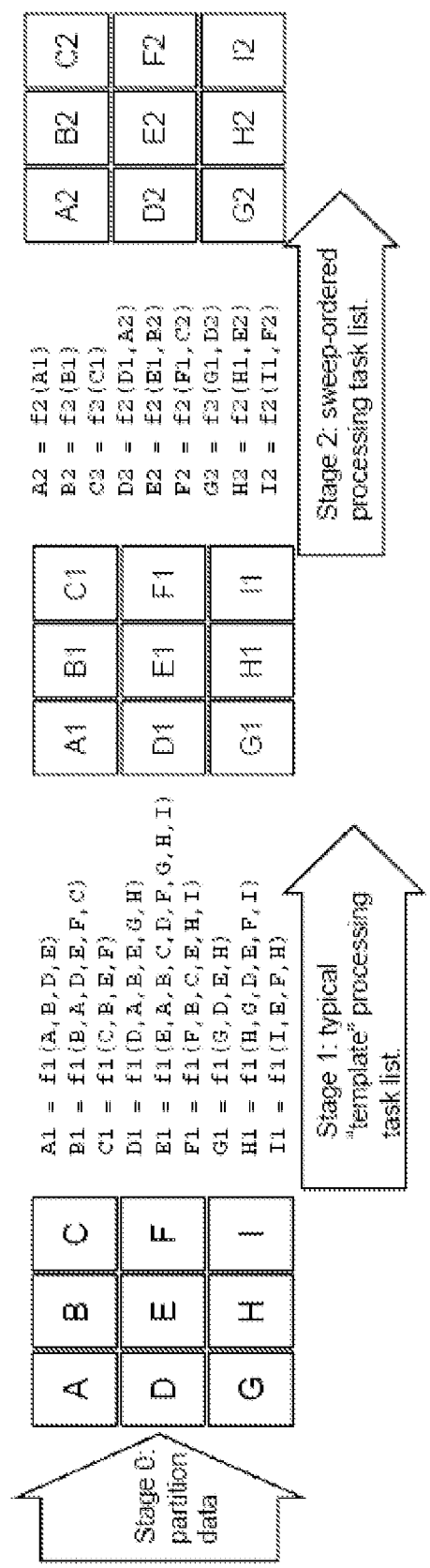
FIG. 2D illustrates how a scheduler can improve performance by taking into account the dependencies of the different stages in a concurrent work flow in accordance with an embodiment of the present invention.

FIG. 2D illustrates how a scheduler can improve performance by taking into account the dependencies of the different stages in a concurrent work flow in accordance with an embodiment of the present invention.

Two independent stages operating on distributed data are illustrated in FIG. 2D: nine partitioned regions of a layout, A, B, . . . , I. The first stage is decomposed into independent distributed tasks. Each task depends on a "main" partition and all of its neighboring "context" partitions. Because these first stage tasks are independent, they can be executed in any order. The second stage is a sweep ordered process where tasks depend on the results of other tasks in the same stage. Specifically, in this example, each partition task depends on the result of its neighbor above.

Assume we have five processors available on which this flow can be executed (further assume all tasks take the same amount of processing time). If the distributed control were done independently for each stage a likely deployment of tasks might be as follows:

Stage 1:
    deploy five tasks.
    deploy four tasks; 1 CPU idle.
Stage 2:
    deploy 3 tasks (to get results A2, B2, C2); 2 CPUs idle.
    deploy 3 tasks (results D2, E2, F2); 2 CPUs idle.
    deploy 3 tasks (results G2, H2, I2); 2 CPUs idles.

In contrast to the above schedule, an intelligent scheduler can take into account the entire task dependency graph to produce a superior deployment strategy in which the processors are better utilized. Specifically, an intelligent scheduler may determine the following schedule:

Stage 1:
    deploy 5 tasks: A1, B1, C1, D1, E1
    deploy 5 tasks: A2, B2, C2, F1, G1
    deploy 5 tasks: D2, E2, F2, H1, I1
    deploy 3 tasks: G2, H2, I2; 2 CPUs idle.

Note that the intelligent scheduler achieved a 20% reduction of cycle time. Further, note the improved concurrency of the flow is a consequence of optimizing the task dependency graph.

It may not be possible to know all the tasks and the dependencies at the beginning of the flow. Hence, in some embodiments, the scheduler can schedule tasks based on whatever dependency information it has, and as more information becomes available, the scheduler may appropriately modify the schedule.

In addition to scheduling tasks, the scheduler may also monitor the health of executing tasks and detect when a task dies or hangs. The scheduler can also help the work flow recover from faults by restarting failing tasks. Fault recovery may need to rewind to earlier tasks than the ones where a fault was detected. For example, the system may have to rewind to a prior task if the output of a prior task gets corrupted, but is not detected until the next task sees it. Further, the scheduler may help clean up intermediate data files.

Diagonalizing Global Scope Processes

A computation has global scope if it cannot be independently performed on different portions of the layout in an accurate and efficient manner. Conventional solutions to global scope problems often give themselves the luxury of having all data available at the same time. This gives these solutions the greatest freedom on how to construct their underlying algorithms. Unfortunately, when the mask data is very large, e.g., a few terabytes, conventional solutions to global scope problems are inefficient because they spend an inordinate amount of time on I/O operations.

Some embodiments of the present invention are based on the following insight: a global scope problem can be solved incrementally by working on a subset of the input at a time, thereby allowing them to be executed concurrently with other processes in a concurrent work flow. Information obtained from previous subsets can be propagated to subsequent subsets to resolve dependencies that go across subsets, without revisiting the previous computations. The execution of each subset of input data produces a proportion of competed output, and partially computed information that is propagated to the execution of the next subset of input data.

Note that an incremental solution to the global scope problem may not need to access all of the output data at one time. The incremental solution may only need to keep enough output data in memory so that it can resolve any global scope conflicts. In other words, a global scope problem can be implemented in an incremental and concurrent fashion without requiring access to large amounts of data at one time.

The following section uses the template generation stage to illustrate how a global scope stage can be adapted for a concurrent work flow. Adapting a global scope stage for a concurrent work flow can be viewed as "diagonalizing" the global scope stage because the stage can be represented as a diagonal in a concurrent work flow diagram. For example, the DPT coloring problem has been diagonalized in FIG. 2B.

EXAMPLE

Template Generation

Figure 3:
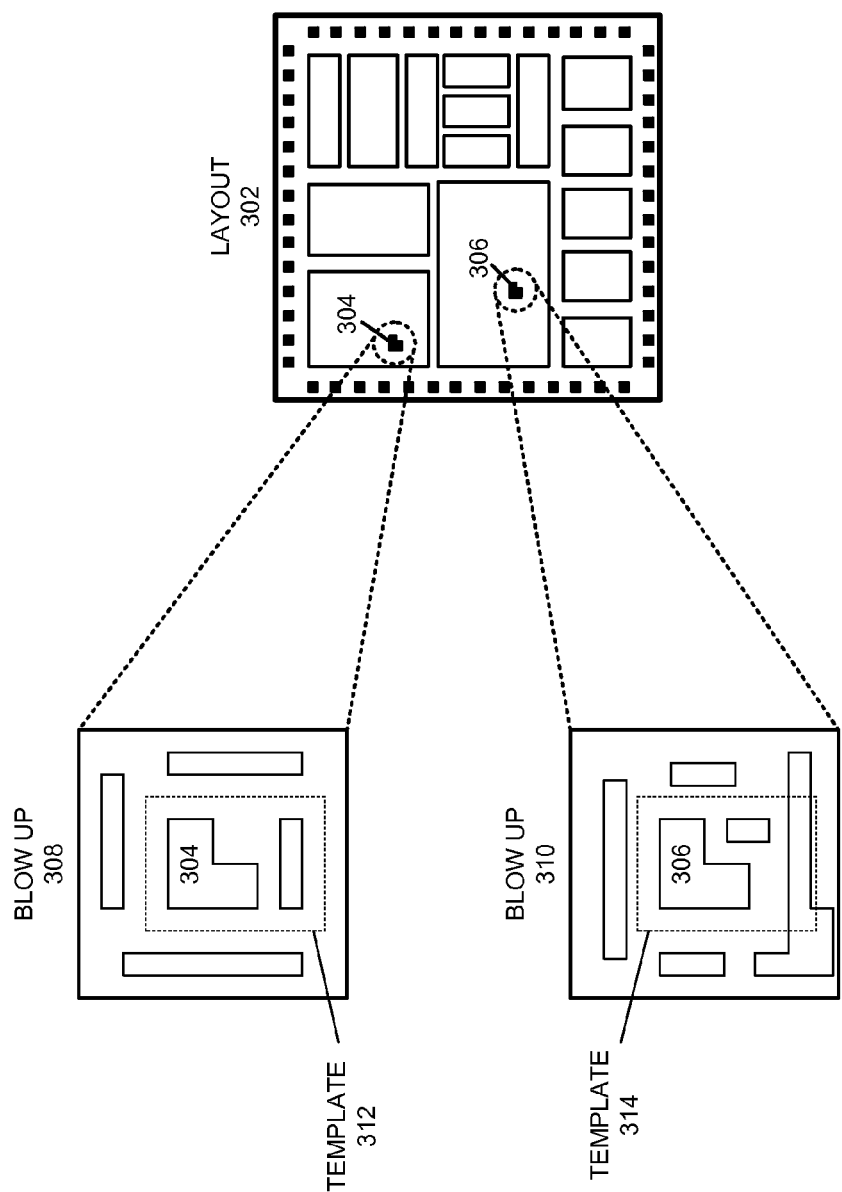
FIG. 3 illustrates templates in accordance with an embodiment of the present invention.

FIG. 3 illustrates templates in accordance with an embodiment of the present invention.

Layout 302 includes cell instances 304 and 306 which are instances of the same cell. Note that, since cell instances 304 and 306 are instances of the same cell, the layout shapes associated with these cell instances are most likely going to be very similar. For example, as shown in blow up 308 and blow up 310, the shape of cell instance 304 is very similar to the shape of cell instance 306. However, as also shown in blow ups 308 and 310, the cell instances may be surrounded by shapes that are different from one another.

A template is a region in the layout which can be used to perform a computation on the layout. The size and shape of a template can depend on the application. For example, for OPC, the size of the template may be based on the interaction ranges of the OPC kernels.

In FIG. 3, templates 312 and 314 include cell instances 304 and 306, respectively. Note that if two templates have the same set of shapes, the system can perform processing on one template, and re-use the results for the other template. For example, the system may perform OPC correction on one of the templates, and re-use the OPC corrections for all other matching templates.

The process for generating a unique set of templates is called template generation and is an important process for many EDA stages. Template generation is not easily performed in a distributed fashion because the process has global scope. This is because, to determine whether a template is unique or not, each template has to be compared with the current database of unique templates. Specifically, if two (or more) processors were performing template generation independently, they would break the uniqueness property because a single unique template would exist separately in each process. Even where this issue could be resolved by exchanging information to synchronize the processes, the concurrent cadence of the overall flow would be lost.

Some embodiments of the present invention perform template generation in an incremental concurrent fashion. Incremental concurrent template generation is not obvious, because if the concurrency in the template generation process is not managed properly, it can lead to performance degradation instead of performance improvement.

Specifically, spatially ordering layout data in a particular manner can help improve the efficiency of some processes. For example, when OPC computation is performed on a template, it typically modifies all of the shapes in the template. By its very nature, the OPC computation is more accurate near the center of the template than at the periphery of the template. This is because the data required to perform OPC accurately at the periphery of the template is present in a neighboring template. Hence, to perform OPC accurately on all of the shapes in the template, the OPC process needs to know the shapes in the neighboring templates. Note that, if template generation was performed in a random spatial order, the OPC computation may not begin until almost all of the templates have been processed. Hence, in the random spatial ordering case, if the template generation process was performed in a concurrent fashion, it may degrade performance because the OPC computation would not be performed concurrently with the template generation process.

Some embodiments of the present invention are based in part on the following insight: if the unique templates are identified in a spatially coherent fashion, they are likely to increase concurrency in a concurrent work flow.

Figure 4:
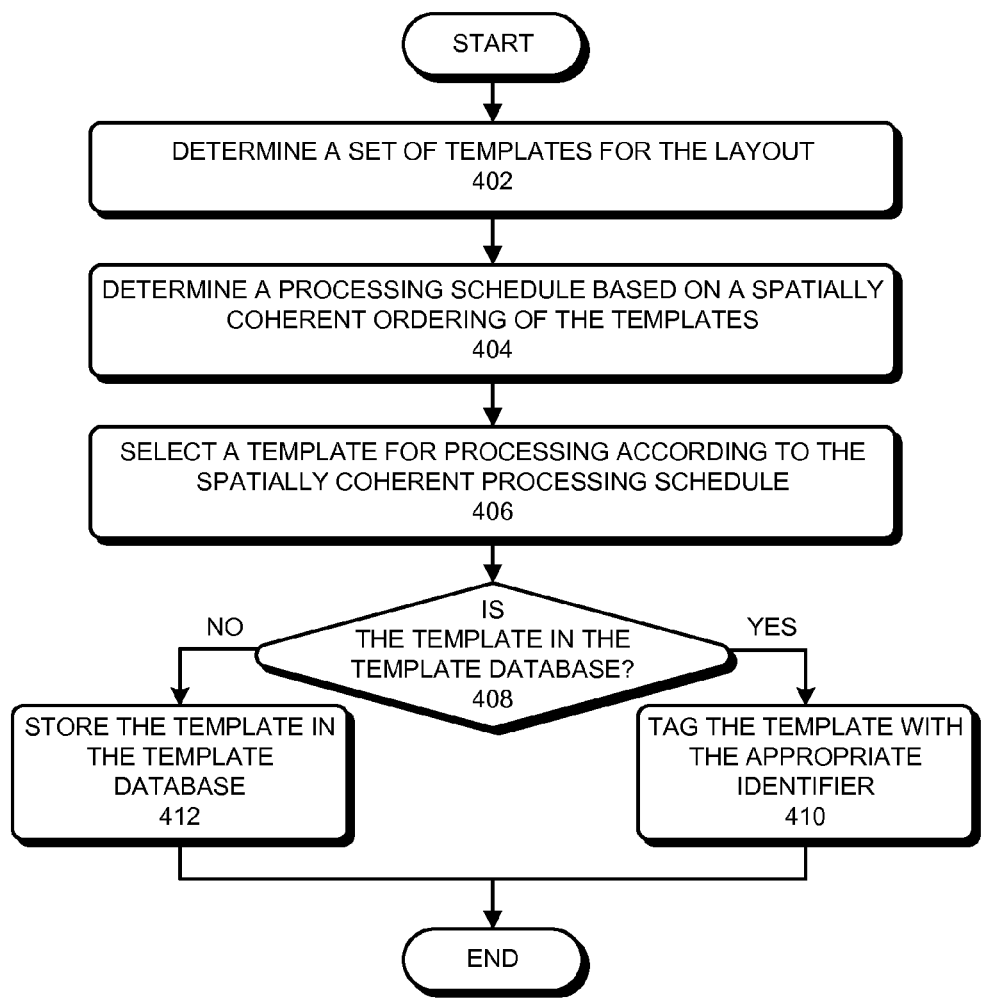
FIG. 4 presents a flow chart that illustrates a process for generating templates in a spatially coherent fashion in accordance with an embodiment of the present invention.

FIG. 4 presents a flow chart that illustrates a process for generating templates in a spatially coherent fashion in accordance with an embodiment of the present invention.

The process can begin by determining a set of templates for the layout, wherein each template in the set of templates is associated with an area in the layout (block 402).

In some embodiments, the system can receive a set of points in the layout. For example, the system may receive a set of points in a region where assist feature placement is desired to be performed. Next, the system can generate a template for each point in the set of points, wherein each template in the set of templates includes polygons in the layout which are located within an ambit (e.g., a radius of influence or an influence range) of the respective point in the set of points.

Note that the template database can be initialized to an empty state. As the template generation process proceeds, templates will be added one by one to the template database.

Figure 5A:
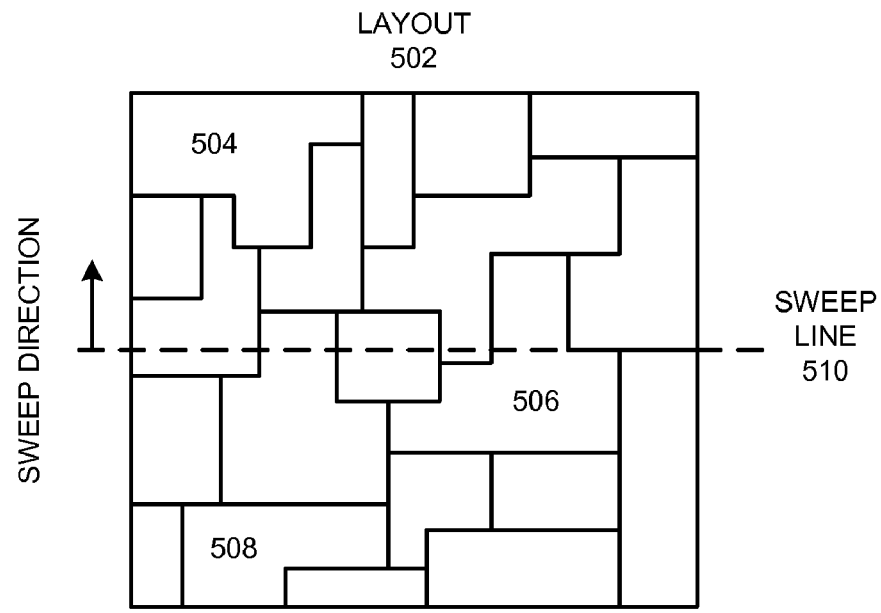
FIG. 5A illustrates how unique templates can be determined for a layout in accordance with an embodiment of the present invention.

FIG. 5A illustrates how unique templates can be determined for a layout in accordance with an embodiment of the present invention. Note that FIG. 5A is for illustration purposes only and is not intended to limit the present invention to the forms disclosed.

Layout 502 can be divided into a number of templates, such as templates 504, 506, and 508. Note that, in general, two templates can overlap one another (FIG. 5A does not show overlapping templates for the sake of clarity). Templates can have different shapes and sizes and each template can have a particular location in the layout. In some embodiments, the skeleton file can specify the locations, shapes, and sizes of the templates, and the set of graphics files can specify the layout data (e.g., the polygons) for each template.

Continuing with the description of FIG. 4, the system can determine a processing schedule based on a spatially coherent ordering of the templates (block 404).

For example, FIG. 5A illustrates how a sweep line can be used to generate a spatially coherent processing schedule. Specifically, sweep line 510 can be moved from one side of the layout to the opposite side. As the sweep line moves, the system can keep track of the order in which the sweep line intersects the templates. Next, the system can determine the processing schedule based on this order.

Note that the system can use a plurality of techniques to generate a spatially coherent ordering. For example, the sweep line can be moved diagonally, i.e., from one corner of the layout to the opposite corner. Further, the spatial ordering can also be based on other geometric shapes or paths, such as rectangles, circles, ovals, spirals, etc.

Figure 5B:
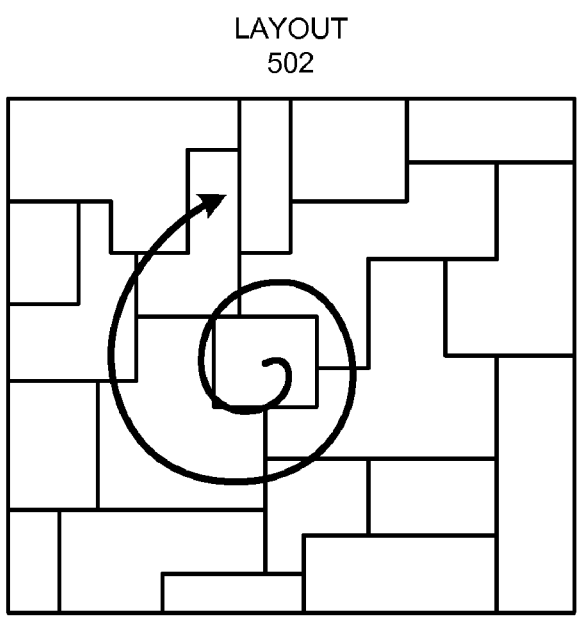
FIG. 5B illustrates how a spiral can be used to generate a spatially coherent processing schedule in accordance with an embodiment of the present invention.

FIG. 5B illustrates how a spiral can be used to generate a spatially coherent processing schedule in accordance with an embodiment of the present invention. The system may start at the center of the layout and move away from the center along a spiral path. The spatial ordering of the templates can be determined by keeping track of the order in which the templates intersect the spiral path.

Note that the above-described examples of spatially coherent ordering have been presented for illustration purposes only, and are not intended to limit the invention to the forms disclosed.

Continuing with the description of FIG. 4, the system can then select a template for processing according to the spatially coherent processing schedule (block 406).

Next, the system can determine whether the template is in the template database (block 408). To match two templates, the system can compare the polygons of the two templates. If, for each polygon in one template, there is a corresponding polygon in the other template, the system can conclude that the two templates match. In some embodiments, the system can compute a hash value using the coordinates of the polygons in the template. Next, to determine whether two templates match each other, the system can compare the hash values associated with the two templates.

If a template is already present in the template database, the system can tag the template with the appropriate identifier (block 410). For example, if the template matches a stored template that is associated with a particular identifier, the system can associate the matched template with the same identifier.

On the other hand, if a template does not match any of the stored templates, the system can store the template in the template database (block 412).

Computer System and Apparatus

Figure 6:
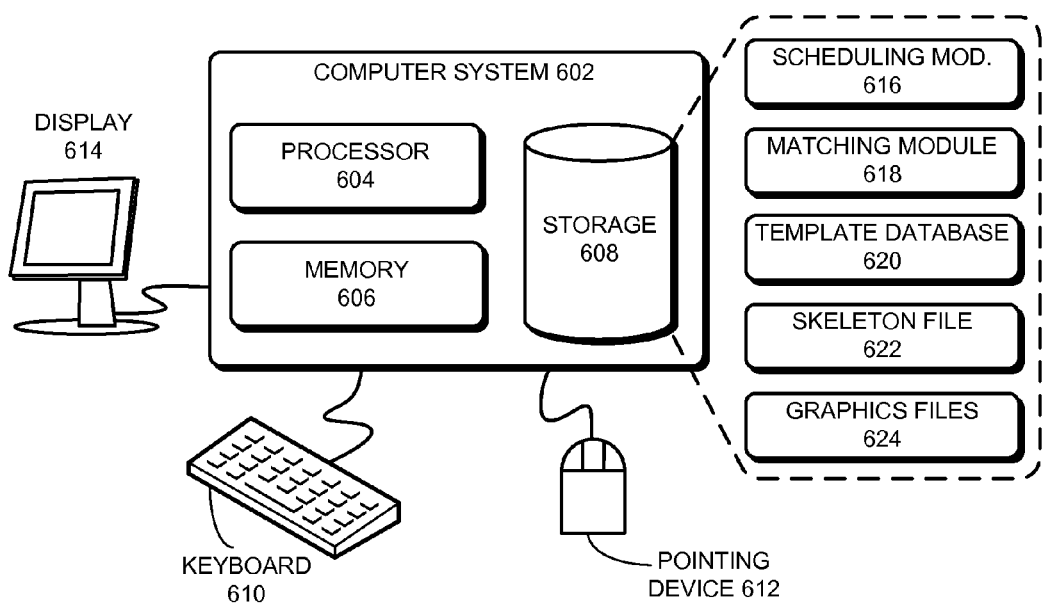
FIG. 6 illustrates a computer system in accordance with an embodiment of the present invention.

FIG. 6 illustrates a computer system in accordance with an embodiment of the present invention.

Computer system 602 comprises processor 604, memory 606, and storage 608. Computer system 602 can be coupled with display 614, keyboard 610, and pointing device 612. Storage 608 can store instructions and/or data that when processed by processor 604 can cause computer system 602 to perform processing that is consistent with a concurrent architecture.

Specifically, storage 608 can store scheduling module 616, matching module 618, template database 620, skeleton file 622, and graphics files 624. Scheduling module 616 and matching module 618 can be used to create template database 620. Skeleton file 622 can represent the locations of the fragments of a layout. Typically, skeleton file 622 is small enough so that it does not cause I/O bottlenecks. Graphics files 624 can contain the detailed graphics for each fragment mentioned in skeleton file 622. The modules shown in FIG. 6 are for illustrative purposes only and are not intended to limit the invention to the forms disclosed.

Figure 7:
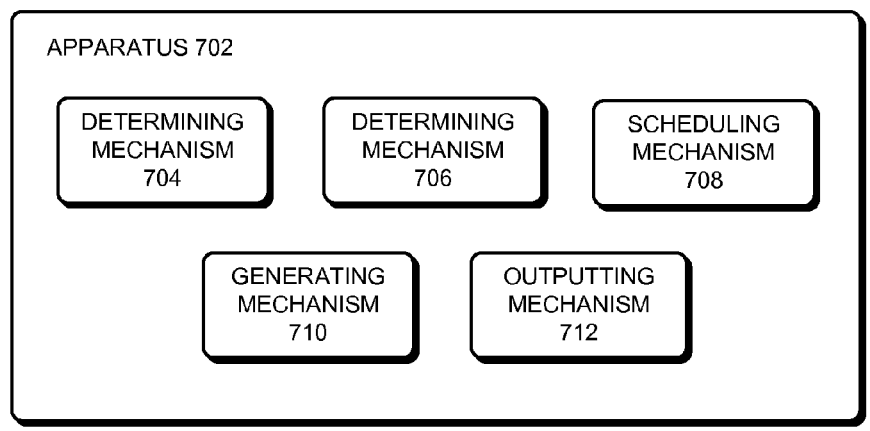
FIG. 7 illustrates an apparatus in accordance with an embodiment of the present invention.

FIG. 7 illustrates an apparatus in accordance with an embodiment of the present invention.

Apparatus 702 can comprise a number of mechanisms which may communicate with one another via a wired or wireless communication channel. Specifically, apparatus 702 can comprise determining mechanism 704, determining mechanism 706, scheduling mechanism 708, generating mechanism 710, and outputting mechanism 712. In some embodiments, determining mechanism 704 can be configured to determine a set of templates, determining mechanism 706 can be configured to determine a spatially coherent ordering for the set of templates, scheduling mechanism 708 can be configured to determine a processing schedule based on the spatially coherent ordering for the set of templates, generating mechanism 710 can be configured to generate the template database as the set of templates are processed in the spatially coherent order, and outputting mechanism 712 can be configured to output the unique templates as they are identified.

Apparatus 702 can be part of a computer system or be a separate device which is capable of communicating with other computer systems and/or devices. Apparatus 702 may be realized using one or more integrated circuits. Specifically, one or more mechanisms in apparatus 702 can be implemented as part of a processor.

CONCLUSION

The data structures and code described in this detailed description are typically stored on a computer-readable storage device, which may be any device that can store code and/or data for use by a computer system. The computer-readable storage device includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage device as described above. When a computer system reads and executes the code and/or data stored on the computer-readable storage device, the computer system performs the methods and processes embodied as data structures and code and stored within the computer-readable storage device.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to fabricate an integrated circuit, the method comprising:
   generating mask data based on an integrated circuit design, wherein said generating includes:
     determining a layout based on the integrated circuit design;
     determining a set of templates for the layout, wherein each template in the set of templates is associated with an area in the layout;
     determining a processing schedule for the set of templates based on a spatially coherent ordering of the set of templates;
     performing a first processing stage on a first template from the set of templates based on the processing schedule; and
     performing a second processing stage on a second template from the set of templates based on the processing schedule, wherein the second processing stage is performed concurrently with the first processing stage, and wherein the second processing stage is performed on the first template after the first processing stage completes processing the first template; and fabricating the integrated circuit based on the mask data.

2. The method of claim 1, wherein determining the set of templates involves:
receiving a set of points in the layout; and
generating a template for each point in the set of points, wherein each template in the set of templates includes polygons in the layout which are located within an ambit of the respective point in the set of points.

3. The method of claim 1, wherein the first processing stage is mask rule check, and the second processing stage is mask data preparation.

4. The method of claim 1, wherein the first processing stage and the second processing stage are executed by different processors.

5. The method of claim 1, wherein determining a processing schedule involves:
positioning a sweep line at a first edge of the layout;
moving the sweep line toward a second edge of the layout which is located opposite to the first edge; and
determining the processing schedule based in part on an order in which the sweep line intersects the set of templates.

6. The method of claim 1, wherein determining a processing schedule involves:
determining a path in the layout; and
determining the processing schedule based in part on an order in which the path intersects the set of templates.

7. A non-transitory computer-readable storage medium storing instructions that when executed by a computer, cause the computer to perform a method to generate mask data based on an integrated circuit design, the method comprising:
determining a layout based on the integrated circuit design;
determining a set of templates for the layout, wherein each template in the set of templates is associated with an area in the layout;
determining a processing schedule for the set of templates based on a spatially coherent ordering of the set of templates;
performing a first processing stage on a first template from the set of templates based on the processing schedule; and
performing a second processing stage on a second template from the set of templates based on the processing schedule, wherein the second processing stage is performed concurrently with the first processing stage, and wherein the second processing stage is performed on the first template after the first processing stage completes processing the first template.

8. The non-transitory computer-readable storage medium of claim 7, wherein determining the set of templates involves:
receiving a set of points in the layout; and
generating a template for each point in the set of points, wherein each template in the set of templates includes polygons in the layout which are located within an ambit of the respective point in the set of points.

9. The non-transitory computer-readable storage medium of claim 7, wherein the first processing stage is mask rule check, and the second processing stage is mask data preparation.

10. The non-transitory computer-readable storage medium of claim 7, wherein the first processing stage and the second processing stage are executed by different processors.

11. The non-transitory computer-readable storage medium of claim 7, wherein determining a processing schedule involves:
positioning a sweep line at a first edge of the layout;
moving the sweep line toward a second edge of the layout which is located opposite to the first edge; and
determining the processing schedule based in part on an order in which the sweep line intersects the set of templates.

12. The non-transitory computer-readable storage medium of claim 7, wherein determining a processing schedule involves:
determining a path in the layout; and
determining the processing schedule based in part on an order in which the path intersects the set of templates.

13. A system to generate mask data based on an integrated circuit design, the system comprising:
two or more processors; and
a computer-readable storage device storing instructions, comprising:
instructions for determining a layout based on the integrated circuit design;
instructions for determining a set of templates for the layout, wherein each template in the set of templates is associated with an area in the layout;
instructions for determining a processing schedule for the set of templates based on a spatially coherent ordering of the set of templates;
instructions for performing, using a first processor, a first processing stage on a first template from the set of templates based on the processing schedule; and
instructions for performing, using a second processor, a second processing stage on a second template from the set of templates based on the processing schedule, wherein the second processing stage is performed concurrently with the first processing stage, and wherein the second processing stage is performed on the first template after the first processing stage completes processing the first template.

14. The system of claim 13, wherein the instructions for determining the set of templates include:
instructions for receiving a set of points in the layout; and
instructions for generating a template for each point in the set of points, wherein each template in the set of templates includes polygons in the layout which are located within an ambit of the respective point in the set of points.

15. The system of claim 13, wherein the first processing stage is mask rule check, and the second processing stage is mask data preparation.

16. The system of claim 13, wherein the instructions for determining the processing schedule include:
instructions for positioning a sweep line at a first edge of the layout;
instructions for moving the sweep line toward a second edge of the layout which is located opposite to the first edge; and
instructions for determining the processing schedule based in part on an order in which the sweep line intersects the set of templates.

17. The system of claim 13, wherein the instructions for determining the processing schedule include:
instructions for determining a path in the layout; and
instructions for determining the processing schedule based in part on an order in which the path intersects the set of templates.

* * * * *